(12) United States Patent
Park

(10) Patent No.: US 7,947,414 B2
(45) Date of Patent: May 24, 2011

(54) METHOD OF FABRICATING HALFTONE PHASE SHIFT MASK

(75) Inventor: Eui-Sang Park, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 249 days.

(21) Appl. No.: 12/249,935

(22) Filed: Oct. 12, 2008

(65) Prior Publication Data
US 2009/0104543 A1    Apr. 23, 2009

(30) Foreign Application Priority Data

Oct. 22, 2007   (KR) .................. 10-2007-0106050

(51) Int. Cl.
*G03F 1/00*    (2006.01)
*G03C 5/00*    (2006.01)
(52) U.S. Cl. ........................ 430/5; 430/311; 430/394
(58) Field of Classification Search .............. 430/5, 311, 430/394
See application file for complete search history.

(56) References Cited

U.S. PATENT DOCUMENTS

| | | | | |
|---|---|---|---|---|
| 6,110,624 A * | 8/2000 | Hibbs et al. | ...................... | 430/5 |
| 2007/0207391 A1 * | 9/2007 | Lee et al. | .......................... | 430/5 |
| 2007/0231715 A1 * | 10/2007 | Han et al. | .......................... | 430/5 |

* cited by examiner

*Primary Examiner* — Stephen Rosasco
*Assistant Examiner* — Rashid Alam
(74) *Attorney, Agent, or Firm* — Sherr & Vaughn, PLLC

(57) ABSTRACT

A method of fabricating a halftone phase shift mask is disclosed, by which a process time and a failure ratio can be reduced by sequentially forming a phase shift layer a first photoresist, a metal layer and a second photoresist over a transparent substrate, performing a process to expose a portion of the metal layer, and then performing an etching process to expose a portion of the substrate using the second photoresist as a mask, and then performing an electron-beam exposure process on a portion of the first photoresist such that electrons contact the surface of the transparent substrate, and then simultaneously developing a portion of the first photoresist and removing a portion of the metal layer and a remaining portion of the first photoresist to expose a portion of the phase shift layer.

18 Claims, 4 Drawing Sheets

METHOD OF FABRICATING HALFTONE PHASE SHIFT MASK

The present application claims priority under 35 U.S.C. §119 to Korean Patent Application No. 10-2007-0106050 (filed on Oct. 22, 2007), which is hereby incorporated by reference in its entirety.

BACKGROUND

In semiconductor device fabrication, a photomask may generally be used as an exposure mask when forming a fine pattern. As a photomask, a phase shift mask is used to enhance resolution of a transcript pattern by giving a phase difference between exposure lights transmitted through the mask. In particular, a halftone phase shift mask has been developed and used as a sort of the phase shift mask.

Figure 1A:
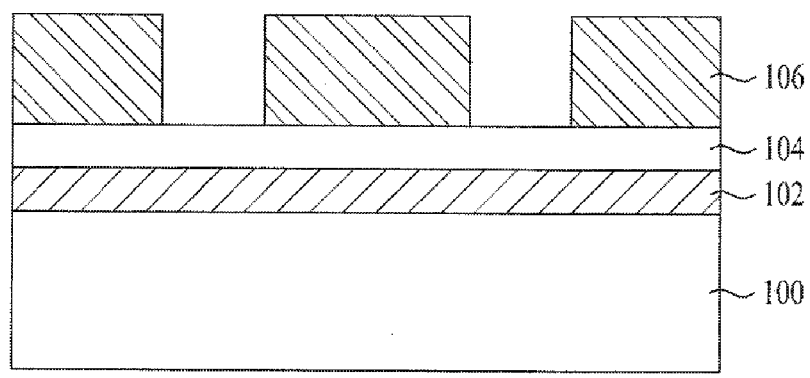

As illustrated in example FIG. 1A, a method of fabricating a halftone phase shift mask may include forming phase shift layer 102 composed of Mo-silicide oxynitride on and/or over a surface of transparent substrate 100 composed of quartz. Metal layer 104 composed of chromium (Cr) is formed on and/or over phase shift layer 102. First photoresist 106 is coated on and/or over substrate 100 including metal layer 104 and phase shift layer 102. Exposure and development are then performed on first photoresist 106 using a prescribed exposure mask to expose a portion of metal layer 104.

Figure 1B:
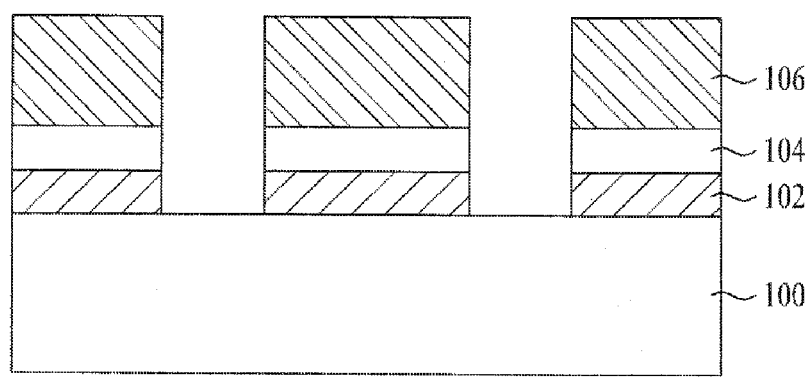

As illustrated in example FIG. 1B, phase shift layer 102 and metal layer 104 are then etched in part by a prescribed etch process using first photoresist 106 as a mask to expose a portion of transparent substrate 100.

Figure 1C:
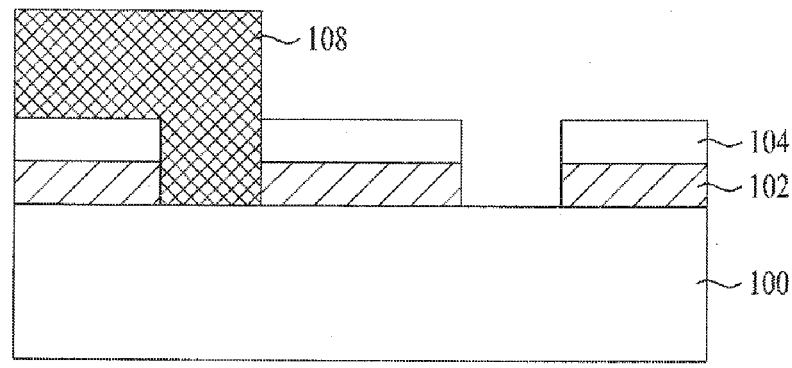

As illustrated in example FIG. 1C, after removing first photoresist 106, second photoresist 108 is coated on and/or over transparent substrate 100 including phase shift layer and metal layer 104. Exposure and development are then performed on second photoresist 108 using a prescribed exposure mask such that second photoresist 108 can cover a portion of metal layer 104 only.

Figure 1D:
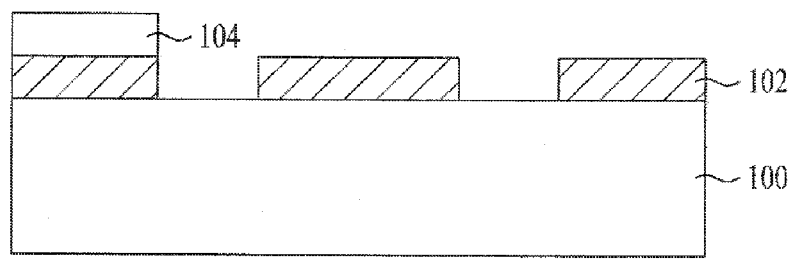

As illustrated in example FIG. 1D, a portion of metal layer 104 not covered by second photoresist 108 is etched by a prescribed etch process using second photoresist 108 as a mask. However, such a halftone phase shift fabricating method is complicated since it requires a photoresist coating process and second exposure process to expose the phase shift layer after completion of the first exposure. This, in turn, increases the failure ratio and processing time.

SUMMARY

Embodiments relate to a halftone phase shift mask and fabricating method thereof that reduces processing time and a failure ratio.

Embodiments relate to a method of fabricating a halftone phase shift mask that may include at least one of the following steps: sequentially forming a phase shift layer, a first photoresist, a metal layer composed of chromium (Cr) and a second photoresist on and/or over a transparent substrate; and then etching the phase shift layer, the first photoresist and the metal layer in part by a prescribed etch process to expose a portion of the transparent substrate; performing exposure on the first photoresist in part by electron-beam exposure; and then simultaneously developing the first photoresist and removing the metal layer.

Embodiments relate to a method of fabricating a halftone phase shift mask that may include at least one of the following steps: forming a phase shift layer over a substrate; and then forming a first photoresist over the phase shift layer; and then forming a metal layer over the first photoresist; and then forming a second photoresist over the metal layer and then performing a process to expose a portion of the metal layer; and then performing an etching process to expose a portion of the substrate using the second photoresist as a mask and then removing the second photoresist after exposing the portion of the substrate; and then performing an exposure process on a portion of the first photoresist such that electrons contact the surface of the substrate; and then simultaneously developing a portion of the first photoresist and removing a portion of the metal layer and a remaining portion of the first photoresist to expose a portion of the phase shift layer.

Embodiments relate to a method that may include at least one of the following steps: sequentially forming a phase shift layer, a first photoresist, a metal layer and a second photoresist over a substrate having transparency; and then exposing a portion of the uppermost surface of the metal layer; and then exposing a portion of the uppermost surface of the substrate using the second photoresist as a mask; and then treating the surface of the substrate with electrons; and then exposing a portion of the uppermost surface of the phase shift layer.

In accordance with embodiments, a thin photoresist layer may be formed on and/or over a phase shift layer and a metal layer and uses electron-beam exposure for a second exposure, thereby simplifying the fabrication process. Therefore, a process time and a failure ratio can be reduced.

DRAWINGS

Example FIGS. 1A to 1D illustrate a method of fabricating a halftone phase shift mask.

Example FIGS. 2A to 2D illustrate a method of fabricating a halftone phase shift mask, in accordance with embodiments.

DESCRIPTION

Reference will now be made in detail to embodiments for a method of fabricating a halftone phase shift mask, examples of which are illustrated in the accompanying drawings. Wherever possible, the same reference numbers will be used throughout the drawings to refer to the same or like parts.

Figure 2A:
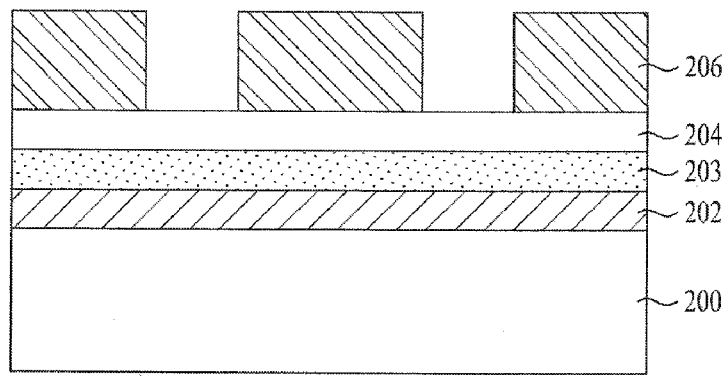

Referring to FIG. 2A, phase shift layer 202 composed of Mo-silicide oxynitride is formed on and/or over substrate 200 composed of a transparent material such as quartz. First photoresist 203 may then be coated on and/or over phase shift layer 202. First photoresist 203 is coated to a thickness in a range between approximately 1,000 to 5,000 Å. Metal layer 204, which may be composed of chromium (Cr) may then be formed on and/or over first photoresist 203. Second photoresist 206 may then be coated on and/or over metal layer 204 and then exposed and developed to expose a portion of metal layer 204 using a prescribed exposure mask.

Figure 2B:
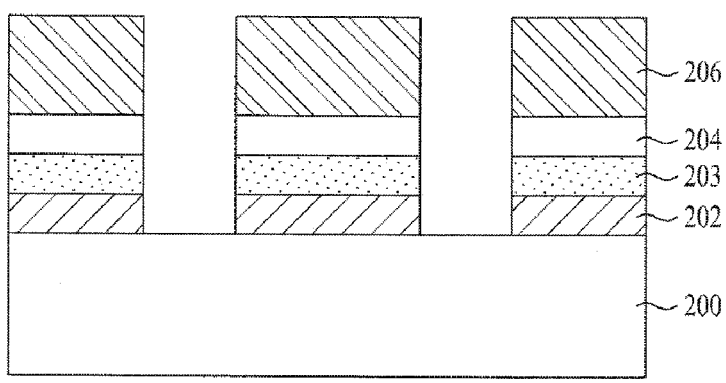

As illustrated in example FIG. 2B, phase shift layer 202, first photoresist 203 and metal layer 204 are then partially etched by a prescribed etch process to expose a portion of transparent substrate 200 using second photoresist 206 as a mask.

Figure 2C:
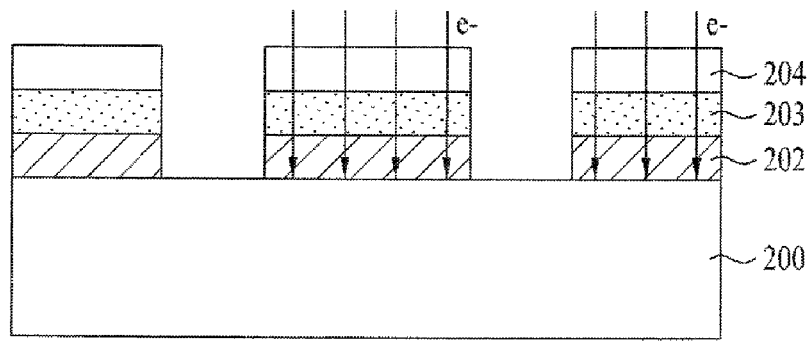

As illustrated in example FIG. 2C, after removing second photoresist 206, exposure is then performed on first photoresist 203 and/or metal layer 104 by an electron-beam (e-beam) exposure process thereby enabling electrons to reach transparent substrate 200 through metal layer 204. The e-beam exposure process may be performed using an electron acceleration voltage in a range between approximately 20 to 100 KeV.

Figure 2D:
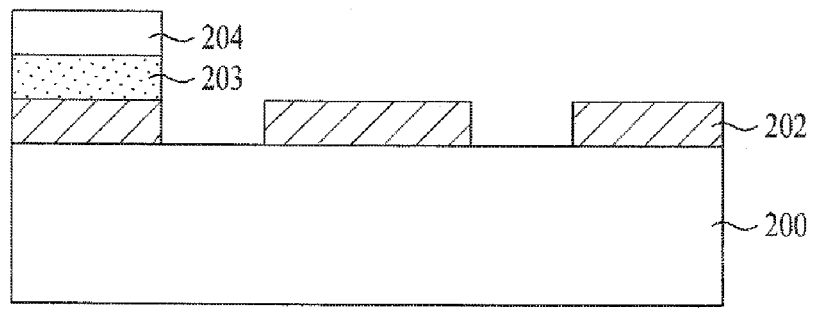

As illustrated in example FIG. 2D, after completion of the e-beam exposure process on first photoresist 203, first photoresist 203 is developed. And, both first photoresist 203 and metal layer 204 are simultaneously removed to expose a specific portion of phase shift layer 202. Accordingly, embodiments do not require use of a second photoresist coating process and a process of etching the metal layer, thereby simplifying the overall process. Therefore, embodiments enable quick fabrication, thereby reducing a process time and a failure ratio.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a halftone phase shift mask comprising:
    sequentially forming a phase shift layer, a first photoresist, a chromium layer and a second photoresist over a transparent substrate; and then
    partially etching the phase shift layer, the first photoresist and the chromium layer to expose a portion of the transparent substrate; and then
    performing exposure on a portion of the first photoresist by electron-beam exposure; and then
    simultaneously developing the first photoresist and removing the chromium layer to expose a portion of the phase shift layer.

2. The method of claim 1, wherein the electron-beam has an electron acceleration voltage in a range between approximately 20 to 100KeV.

3. The method of claim 1, wherein the first photoresist is formed having a thickness in a range between approximately 1,000 to 5,000Å.

4. The method of claim 1, wherein the phase shift layer comprises a Mo-silicide nitride layer.

5. The method of claim 1, further comprising, after sequentially forming the phase shift layer, the first photoresist, the Cr-layer and the second photoresist, performing exposure and development on the second photoresist to expose a portion of the Cr-layer.

6. The method of claim 1, wherein performing exposure on a portion of the first photoresist comprises transmitting electrons to the transparent substrate.

7. A method of fabricating a halftone phase shift mask comprising:
    forming a phase shift layer over a substrate; and then
    forming a first photoresist over the phase shift layer; and then
    forming a metal layer over the first photoresist; and then
    forming a second photoresist over the metal layer and then performing a process to expose a portion of the metal layer; and then
    performing an etching process to expose a portion of the substrate using the second photoresist as a mask and then removing the second photoresist after exposing the portion of the substrate; and then
    performing an exposure process on a portion of the first photoresist such that electrons contact the surface of the substrate; and then
    simultaneously developing a portion of the first photoresist and removing a portion of the metal layer and a remaining portion of the first photoresist to expose a portion of the phase shift layer,
    wherein the metal layer is composed of chromium (Cr).

8. The method of claim 7, wherein the phase shift layer is composed of Mo-silicide nitride.

9. The method of claim 7, wherein the substrate has transparency.

10. The method of claim 9, wherein the substrate is composed of quartz.

11. The method of claim 7, wherein the first photoresist has a thickness in a range between approximately 1,000 to 5,000Å.

12. The method of claim 7, wherein performing an exposure process on the portion of the first photoresist comprises performing an electron-beam exposure process on the first photoresist.

13. The method of claim 12, wherein the electron-beam exposure process may be performed using an electron acceleration voltage in a range between approximately 20 to 100KeV.

14. A method of fabricating a halftone phase shift mask comprising:
    sequentially forming a phase shift layer, a first photoresist, a metal layer and a second photoresist over a substrate having transparency; and then
    exposing a portion of the uppermost surface of the metal layer; and then
    exposing a portion of the uppermost surface of the substrate using the second photoresist as a mask; and then
    treating the substrate with electrons; and then
    exposing a portion of the uppermost surface of the phase shift layer,
    wherein the metal layer is composed of chromium (Cr).

15. The method of claim 14, wherein the phase shift layer is composed of Mo-silicide nitride 16. The method of claim 14, wherein the substrate is composed of quartz.

17. The method of claim 14, further comprising, after exposing the portion of the uppermost surface of the substrate and before treating the substrate with electrons:
    removing the second photoresist.

18. The method of claim 14, wherein treating the substrate with electrons comprises performing an electron-beam exposure process on the first photoresist such that electrons contact the surface of the substrate.

* * * * *